(12) United States Patent
Fan et al.

(10) Patent No.: US 7,730,737 B2
(45) Date of Patent: Jun. 8, 2010

(54) COOLING STATION LIFTER PINS

(75) Inventors: Chao-Hsiang Fan, Shulin (TW); Te-Hsiang Liu, Hsinchu (TW); Chun-Kuang Liu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1472 days.

(21) Appl. No.: 11/019,701

(22) Filed: Dec. 21, 2004

(65) Prior Publication Data

US 2006/0182528 A1 Aug. 17, 2006

(51) Int. Cl.
*F25D 3/12* (2006.01)
(52) U.S. Cl. ............................ 62/383; 62/259.2
(58) Field of Classification Search ............ 62/383, 62/259.2
See application file for complete search history.

(56) References Cited

U.S. PATENT DOCUMENTS

| | | | |
|---|---|---|---|
| 5,356,515 A | 10/1994 | Tahara et al. | |
| 5,566,744 A * | 10/1996 | Tepman | 165/80.1 |
| 5,698,070 A | 12/1997 | Hirano et al. | |
| 6,090,212 A * | 7/2000 | Mahawili | 118/728 |
| 6,372,084 B2 | 4/2002 | Hongo et al. | |
| 6,580,283 B1 * | 6/2003 | Carbone et al. | 324/760 |
| 6,825,555 B2 * | 11/2004 | Hiramatsu et al. | 257/705 |
| 2004/0206747 A1 * | 10/2004 | Ito | 219/468.1 |

* cited by examiner

*Primary Examiner*—Melvin Jones

(57) ABSTRACT

In a cooling station having lifter pins positioned within respective sockets, the lifter pins being positioned for translational movement within platform openings, the improvement comprising forming the lifter pins of aluminum or polymer. A cooling station comprising a cooling station body, a series of sockets affixed to the cooling station body a respective series of lifter pins comprised of aluminum or polymer affixed to the series of sockets, and an platform positioned on the cooling station body. The platform having respective openings positioned above the series of sockets and lifter pins for translational movement of the lifter pins into the platform openings.

16 Claims, 5 Drawing Sheets

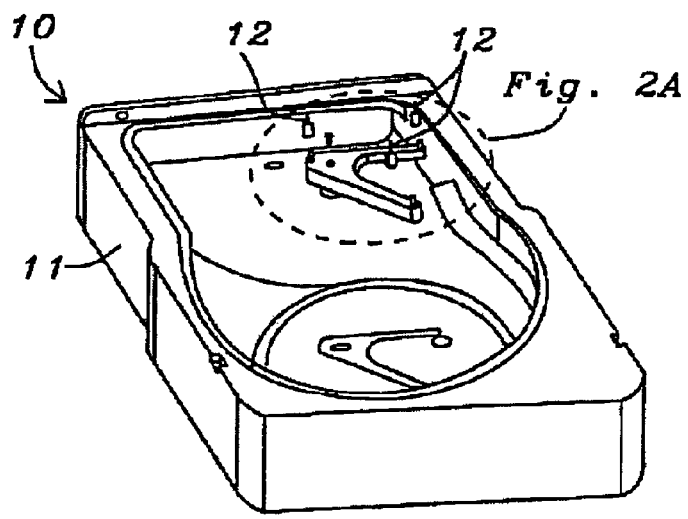
FIG. 1 – Prior Art
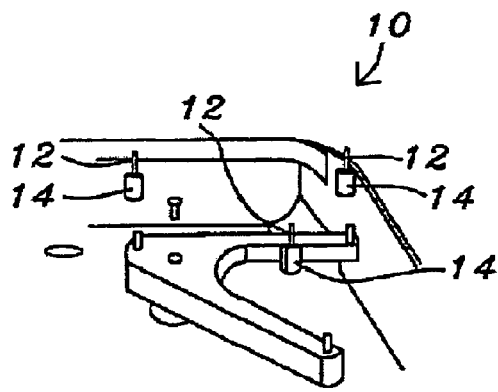
FIG. 2A – Prior Art
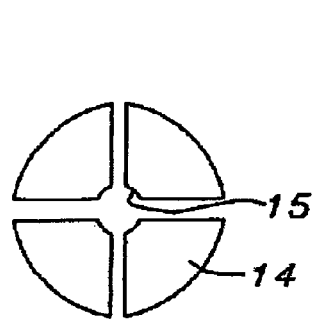
FIG. 2B – Prior Art
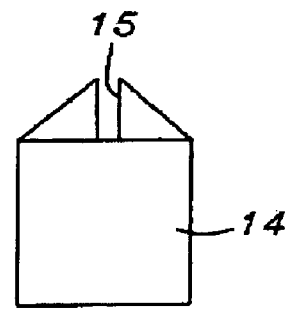
FIG. 2C – Prior Art

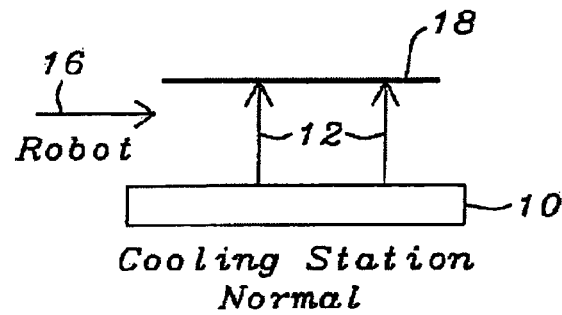
FIG. 3 – Prior Art
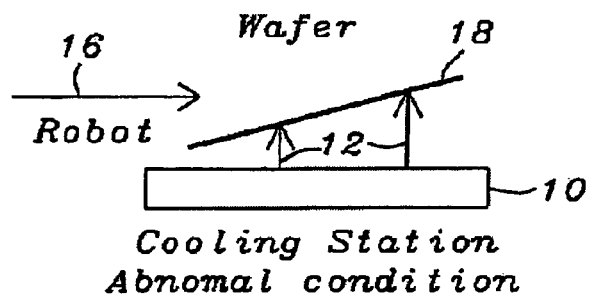
FIG. 4 – Prior Art
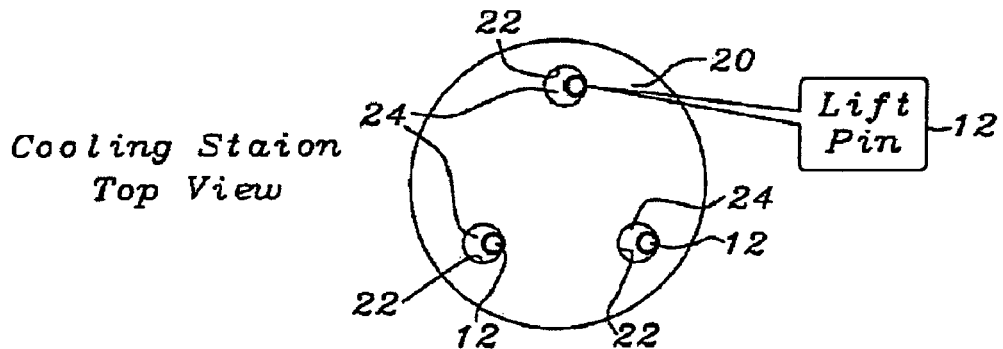
FIG. 5 – Prior Art
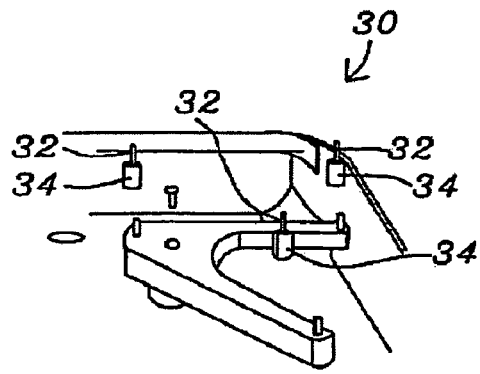
FIG. 6

COOLING STATION LIFTER PINS

BACKGROUND

The present subject matter relates generally to semiconductor fabrication and more specifically to cooling stations used in semiconductor fabrication.

Cooling station lifter pins are currently comprised of ceramic material and may be easily damaged and/or broken thereby deleteriously affecting the performance of the cooling station. When a ceramic lifter pins breaks, it is not uncommon for a robot to crash the wafer, break or scratch the wafer and/or strew particles onto the wafer in a load lock. One such cooling station is the LAM 9600™ Cooling Station manufactured by Brooks which will be used for illustrative purposes hereafter.

FIG. 1 is a perspective view of a portion of a cooling station 10 illustrating three (3) ceramic lifter pins 12 in a V-shaped pattern positioned within a cooling station body 11. The cooling station 10 may be a LAM 9600™ Cooling Station, for example. FIG. 2A is an enlarged portion of FIG. 1 at dashed circle 2 and more clearly illustrates the ceramic lifter pins 12 within the pins' respective sockets 14. FIG. 2B is a further enlarged top plan view of a socket 14 without a pin 12, and FIG. 2C an further enlarged side view of a socket 14 without a pin 12. As more clearly shown in FIGS. 2B and 2C, the socket 14 includes a central opening 15 for the receipt of the pin 12.

One problem with the positioning of ceramic lifter pins within sockets is that a ceramic lifter pin may become separated from its respective socket, resulting in broken ceramic lifter pins.

FIG. 3 illustrates a cooling station 10 operation where a wafer 18 is lifted up by lifter pins (represented by arrows 12) so that a robot (represented by arrow 16) is inserted under the raised wafer 18 to remove wafer 18.

FIG. 4 illustrates a cooling station 10 operation wherein, due to the ceramic composition of the lifter pins 12 or if a robot 16 is not positioned properly, the lifter pins 12 are moved too fast and one or more of the lifter pins 12 may break thereby mispositioning the wafer 18, i.e., not parallel to the robot 16 and/or not positioned above the robot 16. Typically, there is no alarm or other indication of the abnormal operation illustrated by FIG. 4 such that when the robot 16 attempts to extend under the wafer 18, the robot 16 contacts the wafer 18 and possibly breaks the wafer 18.

FIG. 5 is a top plan view of a portion of the cooling station 10 showing the ceramic lifter pins 12 located within openings 24 of a circular platform 20, typically an electrostatic chuck (ESC), in which a wafer is exposed to electricity. As shown in FIG. 5, when the transfer module is pumped down to vacuum, one or more of the current ceramic lifter pins 12 may be unable to maintain a position in the center of the respective openings 24 of the ESC 20. Thus, one or more of the ceramic lifter pins 12 may become positioned very close to one or more of the edges 22 of the openings 24, such that one or more of the ceramic lifter pins 12 may contact the edges 22 of the openings 24 during up and down motion through the ESC 20. Continued friction of the lifter pins 12 against the openings 24 can cause particles from the pin(s) 12 to contaminate the wafer, shorten the life of the lifter pin(s) 12, and cause the pin(s) 12 to break leading to an abnormal cooling station condition as illustrated in FIG. 4.

Accordingly, one or more embodiments of the present subject matter provide an improved lifter pin for cooling stations.

The present subject matter may obviate the deficiencies of the prior art in the following-manner. Specifically, in a cooling station having lifter pins positioned within respective sockets and the lifter pins being positioned for translational movement within platform openings, the improvement wherein the lifter pins are formed of aluminum or polymer. Additionally, a novel cooling station is provided having a cooling station body, a series of sockets affixed to the cooling station body, a respective series of lifter pins comprised of aluminum or polymer affixed to the series of sockets, and a platform positioned on the cooling station body. The platform may have respective openings positioned above the series of sockets and lifter pins for translational movement of the lifter pins into the platform openings.

BRIEF DESCRIPTION OF THE DRAWINGS

The present subject matter will be more clearly understood from the following description taken in conjunction with the accompanying drawings in which like reference numerals designate similar or corresponding elements, regions and portions and in which:

FIG. 1 is a perspective view of a portion of a prior art cooling station.

FIG. 2A is an enlarged portion of FIG. 1 at dashed circle 2.

FIGS. 2B and 2C are further enlargements of the sockets of FIG. 2A.

FIG. 3 is a schematic illustration of a normal cooling station operation.

FIG. 4 is a schematic illustration of an abnormal cooling station operation.

FIG. 5 is a top down view of a portion of a cooling station illustrating ceramic lifter pins located within openings of the ESC.

FIGS. 6 to 13 schematically illustrate a preferred embodiment of the present subject matter.

DETAILED DESCRIPTION

Figure 7:
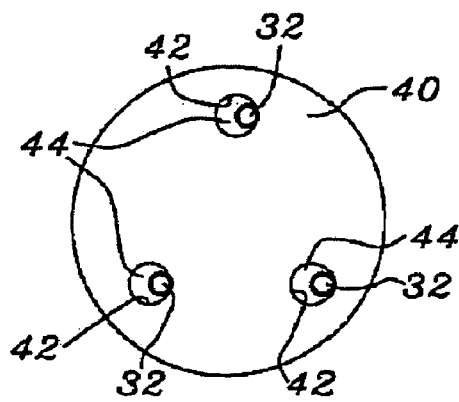

A novel semiconductor fabrication arrangement is disclosed by the present subject matter by forming lifter pins 32 of a cooling station 30 out of aluminum or polymer and preferably aluminum and fixedly attaching the lifter pins 32 to sockets 34 at an eccentricity 50 thereby providing enhanced performance.

FIG. 6 is a perspective view of the lifter pin 32 design of the present subject matter positioned within a portion of a LAM 9600™ Cooling Station 30, for example. The subject matter forms lifter pins 32 out of preferably: aluminum (Al) or a polymer that may be more able to resist impacts; Al lifter pins will be used hereafter for illustrative purposes. Al lifter pins 32 are much less likely to be damaged, break off, and infringe upon the proper operation of the cooling station 30.

As further shown in FIG. 6, and in accordance with the current subject matter, the Al lifter pins 32 are fixedly attached into respective sockets 34 to form a unitary piece. This eliminates the possibility of the Al lifter pins 32 separating from the sockets 34 which may result in damaged or broken lifter pins. Thus, the lifter pins 32 and sockets 34 are preferably comprised of the same material. The one-piece Al lifter pins/sockets 34 are then preferably screwed into the V-type platform.

Figure 10:
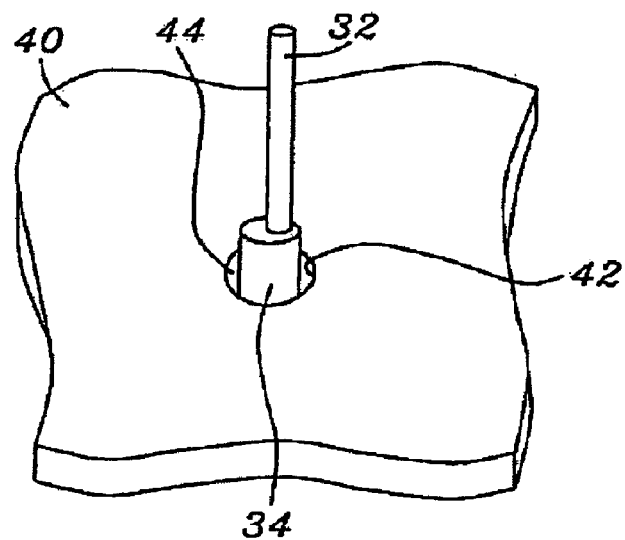

FIG. 7 is a top down view of a portion of the cooling station 30 illustrating positioning of the Al lifter pins 32 within openings 44 of the ESC 20. FIG. 10 is an enlarged perspective view of FIG. 7 of one of the Al lifter pins 32 within its respective ESC opening 44. As shown in FIGS. 7 and 10, when a transfer module is pumped down to vacuum, one or more of the Al lifter pins 32 may be unable to maintain a position in the center of its respective opening 44 of the ESC 20. Thus, one or more of the Al lifter pins 32 may otherwise become positioned very close to one or more of the edges 42 of the ESC openings 44 such that one or more of the Al lifter pins 32 could contact edges 42 of the ESC openings 44 during its up and down motion through the ESC 20.

Figure 11:
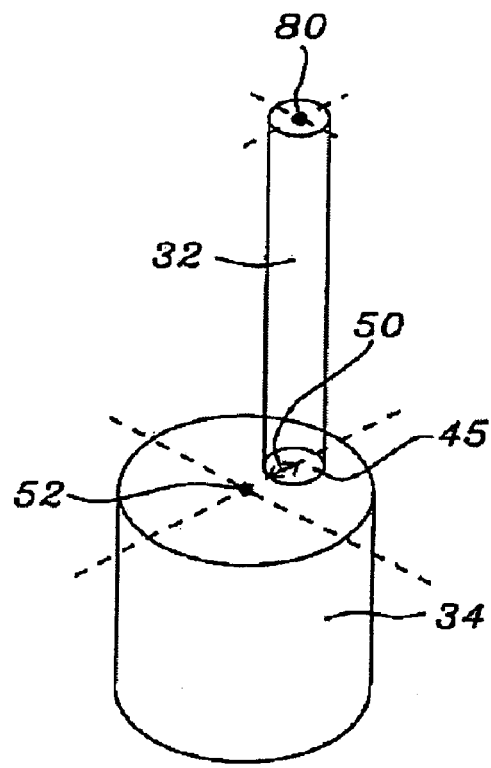

As shown in FIGS. 8, 9 and 11-13 and in accordance with the present subject matter, Al lifter pins 32 are affixed to respective sockets 34 at an offset, or eccentricity 50, from the center 52 of the sockets 34. The eccentricity 50 is preferably about 1 mm from the center. FIG. 11 is a perspective view of FIG. 9 and illustrates the Al lifter pin 32 having a center 80 being offset by an eccentricity 50 from the Al lifter pin center 80 to the center 52 of the socket 34.

Figure 8:
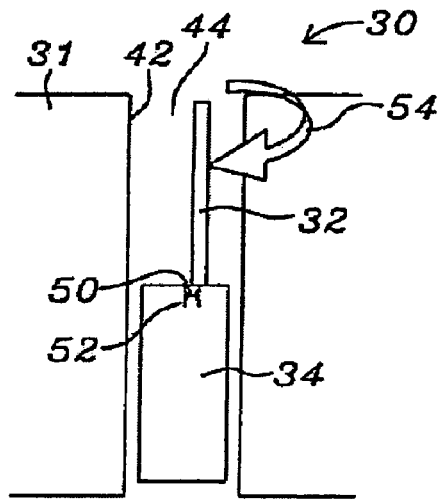
Figure 9:
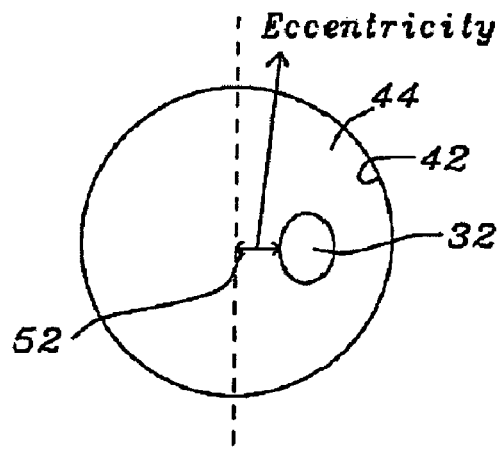
Figure 12:
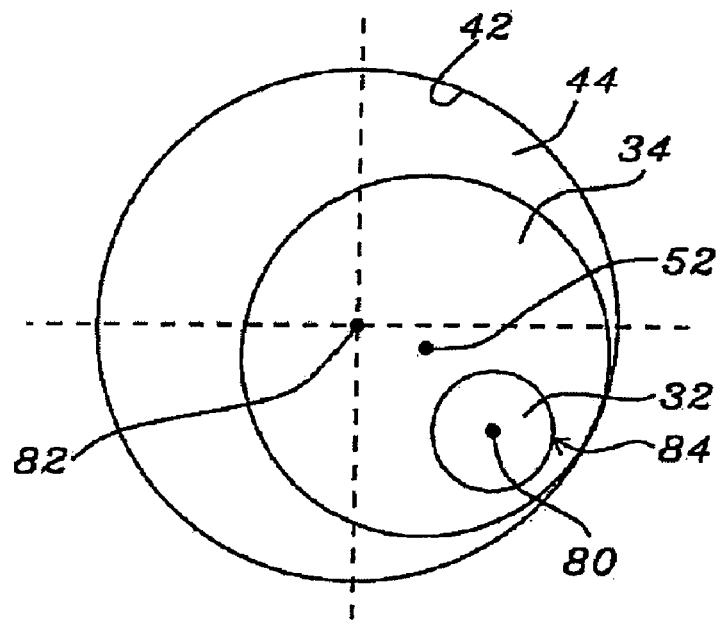
Figure 13:
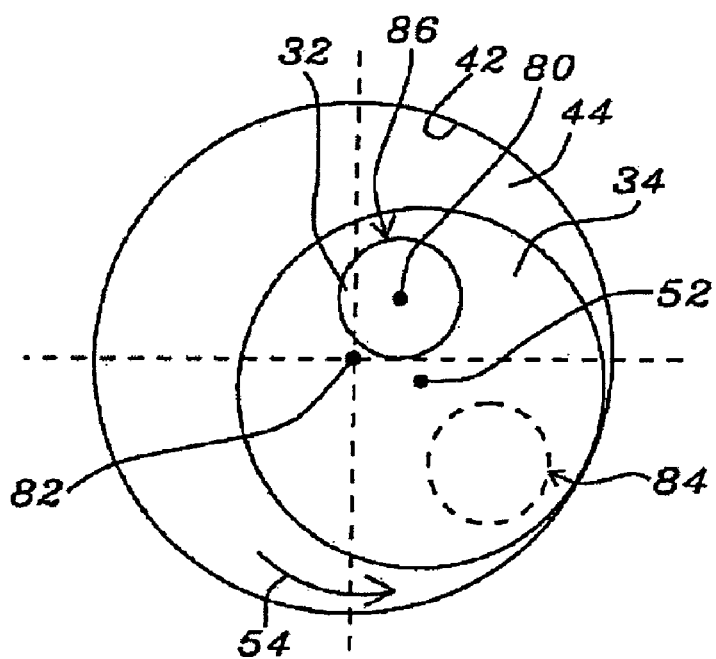

FIG. 12 is a top plan view of FIG. 8 showing a one-piece Al lifter pin/socket 34 positioned within the opening 44 such that the Al lifter pin 32 is deemed to be too close to the edge 42 of the opening 44 (with 82 being the center of the opening 44). A visual inspection may be used to determine if/when the Al lifter pins 32 are too close/touching the edge 42 of the ESC openings 44. Each Al lifter pin 32 should be centered within its respective platform/ESC opening 44. By the use of this eccentricity 50 of the Al lifter pins 32 in relation to respective sockets 34, the Al lifter pins/sockets 34 can be adjusted/rotated 54 as shown in FIGS. 8 and 13 (with FIG. 13 being a top down plan view of a portion of FIG. 8) such that the pins 32 are rotated away from the edge 42 of the ESC openings 44 from a first position 84, shown in dashed line, to a second position 86, shown in solid line. Thus, any friction between the Al lifter pin(s) 32 and the ESC openings 44 is prevented thereby prolonging the life of the Al lifter pin(s) 32 and preventing contamination of the wafer 18. It is also envisioned that each pin may be rotated individually.

While particular embodiments of the present subject matter have been illustrated and described, it is not intended to limit the subject matter, except as defined by the following claims.

We claim:

1. In a cooling station having lifter pins positioned within respective sockets, wherein the respective sockets each have a center, the improvement comprising: fixedly attaching the lifter pins within the respective sockets at an eccentricity from the center of the respective sockets, forming the lifter pins of aluminum or polymer, wherein the respective sockets are configured to be attached to the cooling station body and be selectively rotatable.

2. The cooling station of claim 1, wherein the lifter pins and the respective sockets comprise unitary structures.

3. The cooling station of claim 1, wherein the eccentricity is approximately 1 mm from the center of the respective sockets.

4. A cooling station, comprising:
a cooling station body;
a series of sockets affixed to the cooling station body;
a respective series of lifter pins affixed to the series of sockets, the lifter pins being comprised of aluminum or polymer, wherein the lifter pins are fixedly affixed to the respective sockets; and
a platform positioned on the cooling station body, the platform having respective openings positioned above the series of sockets and lifter pins for translational movement of the lifter pins into the platform openings.

5. The cooling station of claim 4, wherein the lifter pins and the respective sockets comprise unitary structures.

6. The cooling station of claim 4, wherein the respective sockets include centers and the lifter pins are fixedly affixed to the respective sockets at an eccentricity to the respective sockets centers.

7. The cooling station of claim 6, wherein the eccentricity is approximately 1 mm from the respective sockets centers.

8. The cooling station of claim 4, wherein the lifter pins are fixedly affixed to the respective sockets and the sockets are selectively rotatable.

9. The cooling station of claim 4, wherein the respective sockets include centers and the lifter pins are fixedly affixed to the respective sockets at an eccentricity to the respective sockets centers; the platform openings having respective edges; the sockets being selectively rotatable to maintain the lifter pins a predetermined distance from the respective edges of the platform openings during translational movement of the lifter pins into the platform openings.

10. The cooling station of claim 4, wherein the respective sockets include centers and the lifter pins are fixedly affixed to the respective sockets at an eccentricity to the respective sockets centers; the platform openings having respective edges; the sockets being selectively rotatable to maintain the lifter pins a predetermined distance from the respective edges of the platform openings by visual inspection during translational movement of the lifter pins into the platform openings.

11. A cooling station, comprising:
a cooling station body;
a series of sockets affixed to the cooling station body;
a respective series of lifter pins fixedly affixed to the series of sockets; the lifter pins being comprised of aluminum or polymer; the lifter pins and the respective sockets comprising unitary structures; and a platform positioned on the cooling station body; the platform having respective openings positioned above the series of sockets and lifter pins for translational movement of the lifter pins into the platform openings.

12. The cooling station of claim 11, wherein the respective sockets include centers and the lifter pins are fixedly affixed to the respective sockets at an eccentricity to the respective sockets centers.

13. The cooling station of claim 12, wherein the eccentricity is approximately 1 mm from the respective sockets centers.

14. The cooling station of claim 11, wherein the lifter pins are fixedly affixed to the respective sockets and the sockets are selectively rotatable.

15. The cooling station of claim 11, wherein the respective sockets include centers and the lifter pins are fixedly affixed to the respective sockets at an eccentricity to the respective sockets centers; the platform openings having respective edges; the sockets being selectively rotatable to maintain the lifter pins a predetermined distance from the respective edges of the platform openings during translational movement of the lifter pins into the platform openings.

16. The cooling station of claim 11, wherein the respective sockets include centers and the lifter pins are fixedly affixed to the respective sockets at an eccentricity to the respective sockets centers; the platform openings having respective edges; the sockets being selectively rotatable to maintain the lifter pins a predetermined distance from the respective edges of the platform openings by visual inspection during translational movement of the lifter pins into the platform openings.

* * * * *